US008624289B2

(12) United States Patent
Wirth (10) Patent No.: US 8,624,289 B2
(45) Date of Patent: Jan. 7, 2014

(54) OPTOELECTRONIC COMPONENT (75) Inventor: Ralph Wirth, Mintraching-Auhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 55 days.

(21) Appl. No.: 12/680,637

(22) PCT Filed: Sep. 10, 2008

(86) PCT No.: PCT/DE2008/001514
§ 371 (c)(1),
(2), (4) Date: Jul. 12, 2010

(87) PCT Pub. No.: WO2009/039826
PCT Pub. Date: Apr. 2, 2009

(65) Prior Publication Data
US 2010/0308356 A1     Dec. 9, 2010

(30) Foreign Application Priority Data

Sep. 28, 2007   (DE) .......................... 10 2007 046 699
Oct. 17, 2007   (DE) .......................... 10 2007 049 799

(51) Int. Cl.
*H01L 27/15*       (2006.01)
(52) U.S. Cl.
USPC .................. 257/100; 257/95; 257/98; 257/99; 257/E33.001; 438/26; 438/27; 313/502; 313/512
(58) Field of Classification Search
USPC ............ 257/91, 93, 98, 99, E33.072, 100, 95, 257/E33.001; 438/26, 27; 313/502, 512
See application file for complete search history.

(56) References Cited

U.S. PATENT DOCUMENTS 3,676,668 A * 7/1972 Collins et al. ................. 313/499
3,852,798 A   12/1974 Leabailly et al.
(Continued)

FOREIGN PATENT DOCUMENTS

DE    29 42 875       5/1980
DE    690 16 885      6/1995
(Continued)

OTHER PUBLICATIONS

S. C. Allen et al., "EliXIR—Solid-State Luminaire with Enhanced Light Extraction by Internal Reflection", Journal of Display Technology, pp. 155-159, vol. 3, No. 2, Jun. 2007.

*Primary Examiner* — Zandra Smith
*Assistant Examiner* — Tsz Chiu
(74) *Attorney, Agent, or Firm* — Cozen O'Connor (57) ABSTRACT

An optoelectronic component comprising the following features is disclosed, at least one semiconductor body (1) provided for emitting electromagnetic radiation of a first wavelength range, an inner radiation-permeable shaped body (2), into which the semiconductor body (1) is embedded, a wavelength-converting layer (6) on an outer side (5) of the inner shaped body (2), said layer comprising a wavelength conversion substance (8) suitable for converting radiation of the first wavelength range into radiation of a second wavelength range, which is different from the first wavelength range, a coupling-out lens (10), into which the inner shaped body (2) and the wavelength-converting layer (6) are embedded, wherein the coupling-out lens (10) has an inner side enclosed by an inner hemisphere area having a radius $R_{conversion}$, and an outer side enclosing an outer hemisphere area having a radius $R_{outer}$, and the radii $R_{conversion}$ and $R_{outer}$ meet the Weierstrass condition: $R_{outer} \geq R_{conversion} * n_{lens}/n_{air}$, where $n_{lens}$ is the refractive index of the coupling-out lens and $n_{air}$ is the refractive index of the surroundings of the coupling-out lens.

15 Claims, 8 Drawing Sheets

(56) References Cited

U.S. PATENT DOCUMENTS

| | | |
|---|---|---|
| 4,307,935 A | 12/1981 | Monnier |
| 5,055,892 A | 10/1991 | Gardner et al. |
| 5,684,309 A | 11/1997 | McIntosh et al. |
| 5,831,277 A | 11/1998 | Razeghi |
| 6,066,861 A | 5/2000 | Hohn et al. |
| 6,737,681 B2 * | 5/2004 | Koda .................. 257/98 |
| 6,744,077 B2 * | 6/2004 | Trottier et al. ........ 257/103 |
| 6,896,381 B2 * | 5/2005 | Benitez et al. ........ 359/858 |
| 6,897,488 B2 | 5/2005 | Baur et al. |
| 6,995,402 B2 * | 2/2006 | Ludowise et al. ...... 257/91 |
| 7,157,839 B2 * | 1/2007 | Ouderkirk et al. ..... 313/111 |
| 7,479,662 B2 * | 1/2009 | Soules et al. .......... 257/98 |
| 7,791,274 B2 * | 9/2010 | Yano et al. ............ 313/512 |
| 7,800,287 B2 * | 9/2010 | Zheng et al. .......... 313/112 |
| 7,994,529 B2 * | 8/2011 | Bierhuizen et al. .... 257/98 |
| 8,147,100 B2 * | 4/2012 | Yamaguchi .......... 362/311.02 |
| 8,168,998 B2 * | 5/2012 | David et al. ........... 257/100 |
| 2002/0030194 A1 * | 3/2002 | Camras et al. ......... 257/98 |
| 2002/0153835 A1 * | 10/2002 | Fujiwara et al. ....... 313/512 |
| 2004/0079942 A1 * | 4/2004 | Steranka et al. ....... 257/66 |
| 2004/0150991 A1 * | 8/2004 | Ouderkirk et al. ..... 362/231 |
| 2004/0195641 A1 * | 10/2004 | Wirth .................. 257/433 |
| 2005/0051782 A1 | 3/2005 | Negley et al. |
| 2005/0093430 A1 | 5/2005 | Ibbetson et al. |
| 2006/0012298 A1 | 1/2006 | Lee et al. |
| 2006/0097245 A1 | 5/2006 | Aanegola et al. |
| 2007/0023774 A1 | 2/2007 | Wirth et al. |

FOREIGN PATENT DOCUMENTS

| | | |
|---|---|---|
| DE | 196 38 667 | 4/1998 |
| EP | 1 017 113 | 1/1998 |
| EP | 1 455 398 | 3/2004 |
| EP | 1 840 977 | 7/2005 |
| EP | 1 657 758 | 5/2006 |
| GB | 2 311 417 | 9/1973 |
| JP | 2004-524710 | 8/2004 |
| JP | 2006-148147 | 6/2006 |
| JP | 2007-027728 | 2/2007 |
| JP | 2007-035802 | 2/2007 |
| JP | 2007-504972 | 3/2007 |
| WO | WO 98/31055 | 7/1998 |
| WO | WO 01/39282 | 5/2001 |
| WO | WO 02/054502 | 7/2002 |
| WO | WO 02/056390 | 7/2002 |
| WO | WO 02/089217 A2 | 11/2002 |
| WO | WO 02/089217 A3 | 11/2002 |
| WO | WO 2005/025831 | 3/2005 |
| WO | WO 2006/034703 | 4/2006 |
| WO | WO 2007/075393 | 7/2007 |
| WO | WO 2007/126836 | 11/2007 |

* cited by examiner

Abstrahlwinkel θ [°]

□ Kurve 1    ○ Kurve 2    ▽ Kurve 3

OPTOELECTRONIC COMPONENT

RELATED APPLICATIONS

This is a U.S. national stage of application No. PCT/DE2008/001514, filed on Sep. 10, 2008.

The present patent application claims the priority of German application no. 10 2007 046 699.6 filed Sep. 28, 2007 and 10 2007 049 799.9 filed Oct. 17, 2007, the disclosure content of both of which is hereby incorporated by reference.

FIELD OF THE INVENTION

The invention relates to an optoelectronic component.

BACKGROUND OF THE INVENTION

Optoelectronic components comprising a semiconductor body that emits radiation of a first wavelength range generally comprise a wavelength conversion substance for generating mixed-coloured—for instance white—light. The wavelength conversion substance converts part of the radiation of the first wavelength range emitted by the semiconductor body into radiation of a second wavelength range, which is different from the first wavelength range. Such components are described for example in the documents WO 02/056390 A1, WO 2006/034703 A1 and Journal of Display Technology, Vol. 3, No. 2, June 2007, pages 155 to 159. The wavelength conversion substance can for example be introduced into a potting resin of the semiconductor body or be applied directly to the semiconductor body in the form of a layer.

SUMMARY OF THE INVENTION

It is an object of the invention to specify an optoelectronic component comprising a wavelength conversion substance, wherein the optoelectronic component has a high efficiency.

An optoelectronic component comprises, in particular:
at least one semiconductor body provided for emitting electromagnetic radiation of a first wavelength range,
an inner radiation-permeable shaped body, into which the semiconductor body is embedded,
a wavelength-converting layer on an outer side of the inner shaped body, said layer comprising a wavelength conversion substance suitable for converting radiation of the first wavelength range into radiation of a second wavelength range, which is different from the first wavelength range,
a coupling-out lens, into which the inner shaped body and the wavelength-converting layer are embedded, wherein the coupling-out lens has an inner side enclosed by an inner hemisphere area having a radius $R_{conversion}$, and an outer side enclosing an outer hemisphere area having a radius $R_{outer}$, and the radii $R_{converstion}$ and $R_{outer}$ meet the Weierstrass condition:

$$R_{outer} \geq R_{conversion} * n_{lens}/n_{air},$$

where $n_{lens}$ is the refractive index of the coupling-out lens and $n_{air}$ is the refractive index of the surroundings of the coupling-out lens, typically of air.

It should be pointed out at this juncture that the inner and outer hemisphere areas are primarily virtual areas that need not necessarily be embodied as concrete features in the component.

In particular, the coupling-out lens meets the Weierstrass condition described above if the Weierstrass hemisphere shell formed by the inner hemisphere area having the radius $R_{conversion}$ and the outer hemisphere shell having the radius $R_{outer}$ lies in its entirety within the coupling-out lens.

Particularly preferably, the Weierstrass hemisphere shell is free of the wavelength-converting layer.

If the coupling-out lens meets the Weierstrass condition, then in other words the outer side of the coupling-out lens is shaped and arranged at a distance from the radiation-emitting semiconductor body in such a way that the outer side of the coupling-out lens, as seen from every point of the semiconductor body, appears at such a small angle that no total reflection occurs at the outer side of the coupling-out lens. A coupling-out lens that obeys the Weierstrass condition therefore has only very low radiation losses on account of total reflection at its outer side. The coupling-out efficiency of the optoelectronic component is thus advantageously increased.

In the case of the optoelectronic component, the wavelength conversion substance is advantageously arranged at a distance from a radiation-emitting front side of the semiconductor body. The space between the wavelength conversion substance of the wavelength-converting layer and the semiconductor body is substantially filled by the inner shaped body. Particularly preferably, the space between the wavelength-converting layer and the semiconductor body is completely filled with the inner shaped body. Particularly preferably, the inner shaped body is embodied as a potting resin. Since the wavelength conversion substance is arranged at a distance from the radiation-emitting front side of the semiconductor body, the temperature loading of the wavelength conversion substance is advantageously kept small. This likewise increases the efficiency of the device.

The coupling-out lens can be a separately produced element which for example is milled, turned or injection-moulded and fixed to the optoelectronic component in a mounting step.

Furthermore, it is also possible, however, for the coupling-out lens to be produced on the optoelectronic component, for example by the coupling-out lens being produced as a potting resin on the optoelectronic component.

Preferably, a radiation-emitting front side of the semiconductor body is free of the wavelength-converting layer. Particularly preferably, the inner shaped body and/or the coupling-out lens are/is also substantially free of wavelength conversion substance, that is to say that the inner shaped body and/or the coupling-out lens have/has no wavelength conversion substance apart from small contaminations.

In accordance with one embodiment, the optoelectronic component comprises a plurality of semiconductor bodies provided for emitting electromagnetic radiation. Features which are described only on the basis of one semiconductor body, in the case where the optoelectronic component comprises a plurality of semiconductor bodies, can also be exhibited by some or all of the semiconductor bodies.

If the optoelectronic component comprises a plurality of semiconductor bodies, then the latter are preferably arranged in a symmetrical pattern, particularly preferably in a point symmetrical pattern. The semiconductor bodies can be arranged for example along a line or in accordance with a regular grid. The regular grid can be embodied for example in the manner of a square or hexagonal grid.

If the optoelectronic component comprises a plurality of semiconductor bodies, then the latter need not necessarily emit radiation of the same wavelength range. Rather, the semiconductor bodies can emit radiation of different wavelength ranges. In this case, it is also possible for not just one wavelength range to be converted, but also a plurality of wavelength ranges. For this purpose, the component generally has a plurality of different wavelength conversion substances.

In accordance with a further embodiment of the optoelectronic component, the inner shaped body is enclosed by a further hemisphere area having a radius $R_{inner}$ and the radiation-emitting front side of the semiconductor body has an area A. The ratio $A/\pi*R_{inner}^2$ preferably lies between ½ and ¹⁄₂₀, inclusive of the limits.

The further hemisphere area, too, like the inner and outer hemisphere areas, is a virtual, imaginary hemisphere area that need not necessarily be embodied as a concrete feature in the component.

If the optoelectronic component has a plurality of semiconductor bodies, then the semiconductor bodies can be encompassed by an area A' and the ratio $A'/\pi*R_{inner}^2$ preferably lies between ½ and ¹⁄₂₀, inclusive of the limits. The area A' can be for example a circle inscribing the semiconductor bodies. Particularly preferably, the area A' is the minimum area that encompasses all the semiconductor bodies of the optoelectronic component.

In accordance with one embodiment, an outer side of the inner shaped body coincides with the further hemisphere area at least at one point.

In accordance with a further embodiment, the outer side of the inner shaped body coincides with the further hemisphere area.

In accordance with one embodiment, the inner shaped body is shaped in the manner of a hemisphere. In this case, the outer side of the inner shaped body coincides with the further hemisphere area. Particularly preferably, in the case of this embodiment, the inner shaped body is arranged in such a way that the hemisphere is centred above the semiconductor body. That is to say that the center of area of the radiation-emitting front side of the semiconductor body and the midpoint of the hemisphere are situated on an optical axis of the optoelectronic component, wherein the optical axis is perpendicular to the radiation-emitting front side of the semiconductor body. If the optoelectronic component comprises a plurality of semiconductor bodies, then the latter, in the case of this embodiment, are preferably arranged in accordance with a point symmetrical pattern, wherein the centroid of the pattern, which is generally likewise a point of symmetry of the pattern, and the midpoint of the hemisphere are situated on the optical axis.

In accordance with one embodiment, the inner hemisphere area having the radius $R_{conversion}$ coincides with the inner side of the coupling-out lens at least one point.

In accordance with a further embodiment, the inner side of the coupling-out lens coincides with the inner hemisphere area.

In accordance with a further embodiment, the outer side of the coupling-out lens likewise coincides with the outer hemisphere area at least at one point.

In accordance with a further embodiment, the outer side of the coupling-out lens coincides with the outer hemisphere area.

In accordance with one embodiment, the wavelength-converting layer is applied to the inner shaped body in direct contact, that is to say that the wavelength-converting layer forms a common interface with the inner shaped body.

In accordance with a further embodiment, the wavelength-converting layer has a substantially constant thickness. Particularly preferably, the wavelength-converting layer is applied as a hemisphere shell to the inner shaped body, which is preferably likewise embodied as a hemisphere. In this case, the path length of the radiation of the first wavelength range within the wavelength-converting layer is substantially constant.

In accordance with a further embodiment, the coupling-out lens is applied to the wavelength-converting layer in direct contact, that is to say that the coupling-out lens forms a common interface with the wavelength-converting layer.

In accordance with a further embodiment the coupling-out lens is formed in the manner of a hemisphere shell arranged in centred fashion above the semiconductor body, that is to say that the center of area of the radiation-emitting front side of the semiconductor body and the midpoint of the hemisphere shell are arranged on the optical axis of the optoelectronic component. If the optoelectronic component comprises a plurality of semiconductor bodies, then the latter, in the case of this embodiment, are preferably arranged in accordance with a point symmetrical pattern, wherein the centroid of the pattern, which is generally a point of symmetry of the pattern, and the midpoint of the hemisphere shell are situated on the optical axis of the optoelectronic component.

In accordance with a further embodiment, the semiconductor body is applied to a carrier, wherein the carrier has a mirror at least laterally with respect to the semiconductor body. The mirror has the task of deflecting radiation of the first and/or of the second wavelength range, which is sent to a rear side of the optoelectronic component, to a radiation-emitting front side of the optoelectronic component, wherein the front side is arranged opposite to the rear side of the semiconductor body. The rear side of the optoelectronic component can be formed by the carrier, for example. The radiation-emitting front side of the component can be formed by the outer side of the coupling-out lens, for example. Furthermore, further elements, for example an antireflection coating or a UV-absorbing layer, can also be arranged on the outer side of the coupling-out lens.

The mirror can also be formed below the semiconductor body between the semiconductor body and the carrier.

Particularly preferably, the mirror has a reflectance for radiation of the first and/or second wavelength range which is at least 0.9.

Particularly preferably, the mirror has a reflectance for radiation of the first and/or second wavelength range which is at least 0.98.

Furthermore, roughness peaks of the mirror preferably have at most a height of 40 nm.

Particularly preferably, the mirror, at least laterally with respect to the semiconductor body, is embodied such that it is specularly reflective to radiation of the first and/or the second wavelength range.

The mirror can for example comprise a metallic layer or consist of a metallic layer. The metallic layer can for example comprise aluminium or consist of aluminium.

Furthermore, the mirror can comprise a metallic layer and a Bragg mirror or consist of a metallic layer and a Bragg mirror.

The mirror can also be embodied as a reflection-amplifying oxide-based layer system. A reflection-amplifying oxide-based layer system comprises at least one layer which comprises an oxide or consists of an oxide. By way of example, the reflection-amplifying oxide-based layer system comprises two layers comprising an oxide, for example a titanium oxide layer and a silicon oxide layer.

If the mirror comprises a metallic layer and a Bragg mirror, then these are preferably arranged in such a way that the surface of the mirror is formed by the Bragg mirror. A mirror whose surface is formed by a Bragg mirror generally has a small roughness with roughness peaks not higher than 40 nm.

Furthermore, such a mirror is generally embodied such that it is specularly reflective to radiation of the first and/or second wavelength range.

The Bragg mirror is constructed for example alternately from respectively two silicon oxide layers and two titanium oxide layers, that is to say that the Bragg mirror has two silicon oxide layers and two titanium oxide layers which are arranged alternately. The silicon oxide layers comprise silicon oxide or consist of silicon oxide. The titanium oxide layers comprise titanium oxide or consist of titanium oxide.

In accordance with a further embodiment the semiconductor body is arranged in a reflector region of the carrier. The reflector region is formed for example by a depression within the carrier, said depression preferably having oblique side walls.

The carrier can be a printed circuit board, for instance a metal-core circuit board. Furthermore, the carrier can also comprise one of the following materials or consist of one of the following materials: copper, aluminium oxide, aluminium nitride.

The wavelength conversion substance preferably comprises at least one substance from the group formed by the following materials: garnets doped with rare earth metals, alkaline earth metal sulphides doped with rare earth metals, thiogallates doped with rare earth metals, aluminates doped with rare earth metals, orthosilicates doped with rare earth metals, chlorosilicates doped with rare earth metals, alkaline earth metal silicon nitrides doped with rare earth metals, oxinitrides doped with rare earth metals, and aluminium oxinitrides doped with rare earth metals.

In accordance with one embodiment, the wavelength conversion substance is embedded in a binder.

As an alternative, the wavelength conversion substance can also be applied in the form of a layer to the inner shaped body, for example by means of electrophoresis.

In accordance with one embodiment, the inner shaped body and/or the coupling-out lens and/or the binder comprise or consist of a silicone.

The inner shaped body and/or the wavelength-converting layer can comprise scattering particles for improving the emission characteristic.

The scattering particles for example comprise or consist of at least one of the following materials: aluminium oxide, titanium oxide.

The semiconductor body generally comprises an active zone comprising, for generating radiation, for example a conventional pn junction, a double heterostructure, a single quantum well structure or a multiple quantum well structure. Examples of such multiple quantum wells structures are described for example in the documents WO 01/39282, WO 98/31055, U.S. Pat. No. 5,831,277, EP 1 017 113 and U.S. Pat. No. 5,684,309, the disclosure content of which in this respect is hereby incorporated by reference.

If the radiation of the first wavelength range that is emitted by the semiconductor body comprises only visible radiation, then it is generally endeavoured for the wavelength conversion substance to convert only part of this radiation of the first wavelength range into radiation of the second wavelength range, while a further part of the radiation of the first wavelength range that is emitted by the semiconductor body passes through the wavelength-converting layer without being converted. In this case, the optoelectronic component emits mixed light comprising radiation of the first wavelength range and radiation of the second wavelength range.

If the semiconductor body emits for example visible light from the blue spectral range, then part of this visible blue radiation of the first wavelength range can be converted into yellow radiation by means of the wavelength conversion substance, such that the optoelectronic component emits mixed light having a chromaticity coordinate in the white region of the CIE standard chromaticity diagram.

In accordance with one embodiment, the wavelength-converting layer is made thicker within an inner region arranged above the semiconductor body than within an outer region of the wavelength-converting layer, said outer region being arranged laterally with respect to the semiconductor body. The outer region of the wavelength-converting layer is preferably arranged in a manner at least partly running around the inner region of the wavelength-converting layer. In the case of this embodiment, the first wavelength range preferably comprises blue radiation while the second wavelength range comprises yellow radiation. The component preferably emits mixed light having a chromaticity coordinate in the white region of the CIE standard chromaticity diagram. A wavelength-converting layer having a thickness that is larger within the inner region above the semiconductor body than within an outer region laterally with respect to the semiconductor body generally leads to an emission characteristic of the optoelectronic component that is particularly homogeneous with regard to the chromaticity coordinate.

In accordance with a further embodiment, the semiconductor body emits radiation of a first wavelength range comprising ultraviolet radiation. The ultraviolet radiation of the first wavelength range is at least partly converted into visible radiation by the wavelength conversion substance of the wavelength-converting layer. The second wavelength range thus comprises visible radiation. If the semiconductor body emits electromagnetic radiation from the ultraviolet spectral range, then it is generally endeavoured to convert a greatest possible proportion of the ultraviolet radiation of the first wavelength range into visible light, since the ultraviolet radiation does not contribute to the perceptible brightness of the component and furthermore can even damage the human eye.

In accordance with a further embodiment, the coupling-out lens is embodied such that it is absorbent and/or reflective for the electromagnetic radiation from the ultraviolet spectral range. For this purpose, the coupling-out lens can for example comprise glass or consist of glass.

In accordance with a further embodiment, a reflective layer embodied such that it is reflective to radiation of the first wavelength range is arranged on the inner side of the coupling-out lens. Particularly preferably, such a reflective layer is used in combination with a semiconductor body that emits radiation from the ultraviolet spectral range. In this case, the reflective layer is preferably embodied such that it is reflective to ultraviolet radiation of the first wavelength range and permeable to visible radiation of the second wavelength range. However, it is also conceivable to use the reflective layer in combination with a semiconductor body that emits visible radiation, for example, if virtually complete conversion of the radiation of the first wavelength range into radiation of the second wavelength range is sought.

The reflective layer can be for example a dielectric mirror.

DETAILED DESCRIPTION OF THE DRAWINGS

In the exemplary embodiments and figures, identical or identically acting constituent parts are in each case provided with the same reference symbols. The elements illustrated in the figures should not necessarily be regarded as true to scale. Rather, individual constituent parts, such as layer thicknesses for example, may be illustrated in part with exaggerated size in order to afford a better understanding.

Figure 1A:
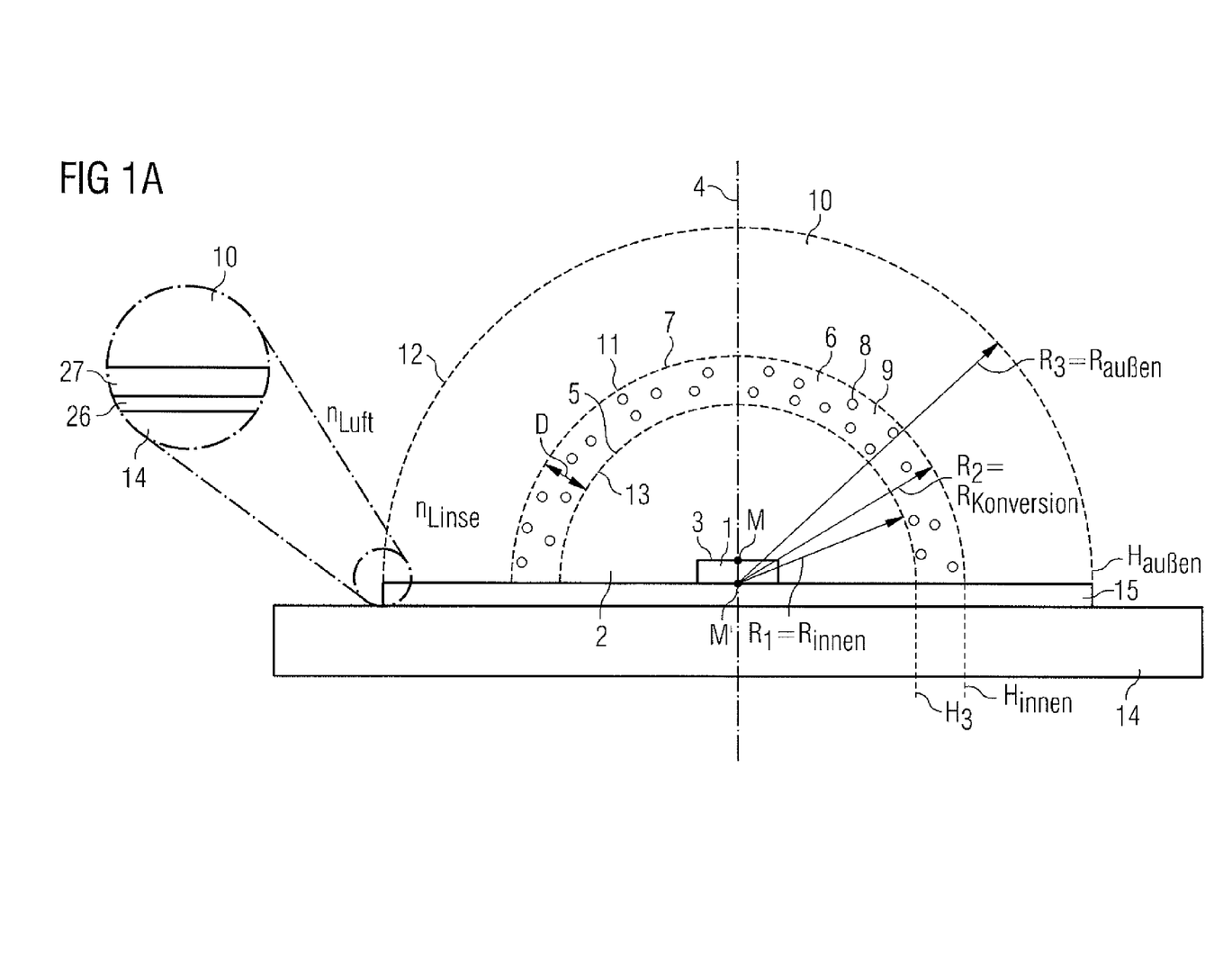
FIG. 1A shows a schematic sectional view of an optoelectronic component in accordance with a first exemplary embodiment.
Figure 1B:
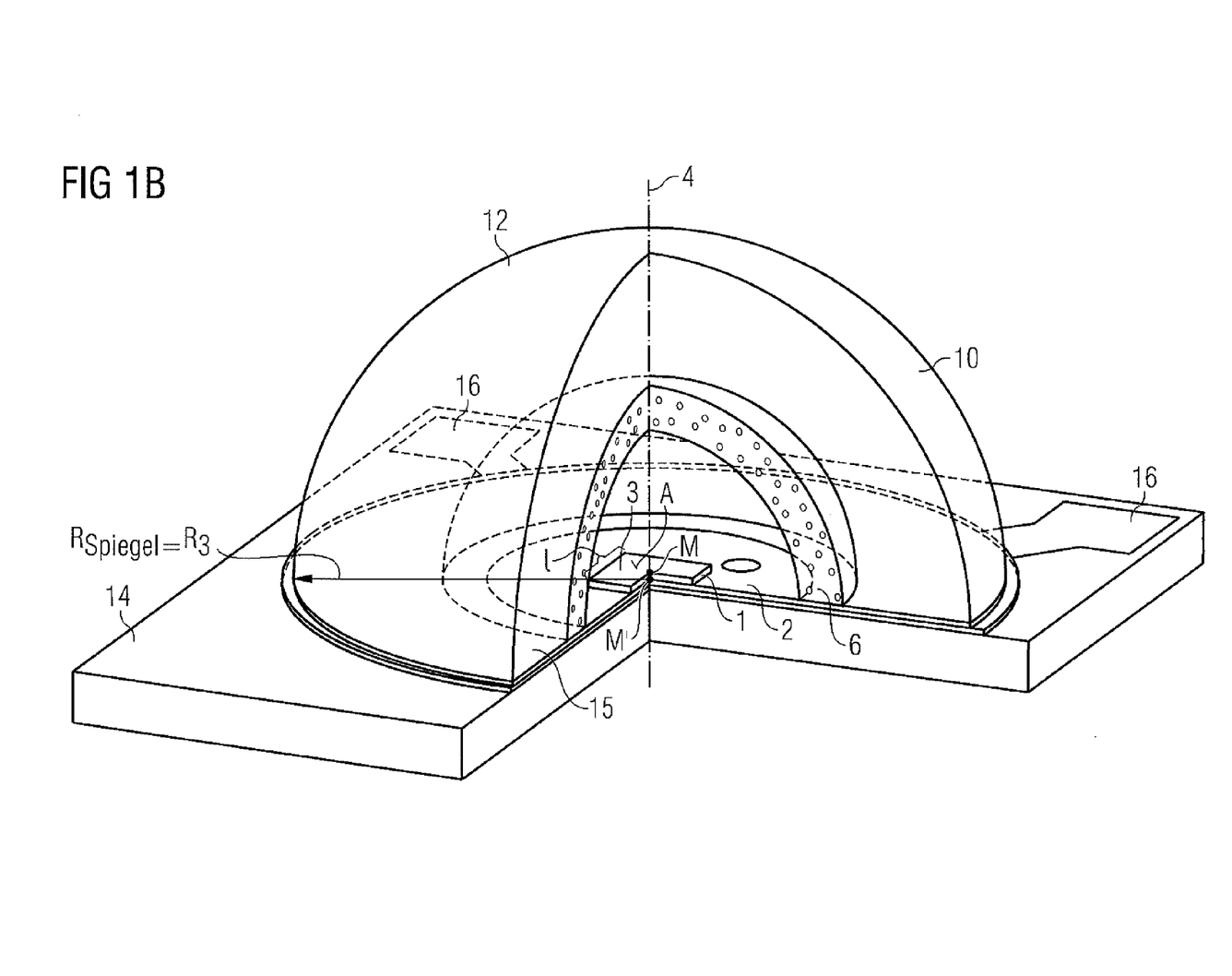
FIG. 1B shows a schematic perspective view of the optoelectronic component in accordance with the exemplary embodiment in FIG. 1A.

The optoelectronic component in accordance with the exemplary embodiment in FIGS. 1A and 1B has a semiconductor body 1 provided for emitting electromagnetic radiation of a first wavelength range. The semiconductor body 1 is embedded into a radiation-permeable inner shaped body 2 in such a way that there is no air-filled space between the semiconductor body 1 and the inner shaped body 2. The inner shaped body 2 is embodied as a hemisphere having a radius $R_1$, which is arranged in centred fashion above the semiconductor body 1, that is to say that the center of area M of a radiation-emitting front side 3 of the semiconductor body 1 and the midpoint M' of the hemisphere formed by the inner shaped body 2 lie on an optical axis 4 of the optoelectronic component, wherein the optical axis 4 is perpendicular to the radiation-emitting front side 3 of the semiconductor body 1.

A wavelength-converting layer 6 is applied on an outer side 5 of the inner shaped body 2. The wavelength-converting layer 6 is applied to the inner shaped body 2 in direct contact, that is to say that the wavelength-converting layer 6 forms a common interface with the inner shaped body 2.

Furthermore the wavelength-converting layer 6 has a substantially constant thickness D. The outer side 7 of the wavelength-converting layer 6 therefore forms a hemisphere area having a radius $R_2$. The ratio of the radius $R_1$ to radius $R_2$ has for example a value of between 0.5 and 0.99, inclusive of the limits. Preferably the ratio of the radius $R_1$ to radius $R_2$ has a value of between 0.6 and 0.95, once again inclusive of the limits. Particularly preferably, the ratio of radius $R_1$ to radius $R_2$ is approximately 0.8.

The wavelength-converting layer 6 comprises a wavelength conversion substance 8 suitable for converting radiation of the first wavelength range that is emitted by the semiconductor body 1 into radiation of a second wavelength range, which is different from the first wavelength range.

The wavelength conversion substance 8 is chosen for example from the group formed by the following substances: garnets doped with rare earth metals, alkaline earth metal sulphides doped with rare earth metals, thiogallates doped with rare earth metals, aluminates doped with rare earth metals, orthosilicates doped with rare earth metals, chlorosilicates doped with rare earth metals, alkaline earth metal silicon nitrides doped with rare earth metals, oxinitrides doped with rare earth metals, and aluminium oxinitrides doped with rare earth metals.

The wavelength conversion substance 8 of the wavelength-converting layer 6 is introduced into a binder 9. The binder 9 can be a silicone, for example.

As an alternative, the wavelength conversion substance 8 can also be applied in the form of a layer to the inner shaped body 2, for example by means of electrophoresis.

Furthermore, the optoelectronic component in accordance with the exemplary embodiment in FIGS. 1A and 1B comprises a coupling-out lens 10 having a refractive index $n_{lens}$, into which the inner shaped body 2 and the wavelength-converting layer 6 are embedded. In the present case, the coupling-out lens 10 forms a common interface with the wavelength-converting layer 6, that is to say that the coupling-out lens 10 is in direct contact with the wavelength-converting layer 6. Furthermore, in the present case the coupling-out lens 10 is embodied as a hemisphere shell having an inner radius $R_2$ and an outer radius $R_3$.

The coupling-out lens 10 of the optoelectronic component meets the Weierstrass condition, as explained below. An inner side 11 of the coupling-out lens 10 having the radius $R_2$ is enclosed by an inner hemisphere area $H_{inner}$ having a radius $R_{conversion}$, while an outer side 12 of the coupling-out lens 10 encloses an outer hemisphere area $H_{outer}$ having a radius $R_{outer}$.

The radii $R_{conversion}$ and $R_{outer}$ meet the Weierstrass condition: $R_{outer} \geq R_{conversion} * n_{lens}/n_{air}$, where $n_{air}$ is the refractive index of the surroundings of the coupling-out lens, typically of air.

The inner hemisphere area $H_{inner}$ and the outer hemisphere area $H_{outer}$ are virtual areas that are illustrated by dashed lines in the figure.

In the present case, the inner hemisphere area $H_{inner}$ coincides with the inner side 11 of the coupling-out lens 10, and $R_2 = R_{conversion}$ holds true. The outer hemisphere area $H_{outer}$ coincides with the outer side 12 of the coupling-out lens 10, and $R_3 = R_{outer}$ holds true.

If the coupling-out lens 10 comprises a silicone with a refractive index $n_{lens}$ of approximately 1.46, then for example the following values for the radii $R_{conversion}$ and $R_{outer}$ meet the Weierstrass condition: $R_{conversion} = 2.2$ mm and $R_{outer} = 4$ mm.

The radiation-emitting front side 3 of the semiconductor body 1 is embodied in square fashion in the present case and has an area A. The inner shaped body 2 is enclosed by a further, likewise virtual, hemisphere area $H_3$ having a radius $R_{inner}$. In the present case, an outer side 13 of the inner shaped body 2 coincides with the further hemisphere area $H_3$, and $R_{inner} = R_1$ holds true. In this case, the ratio $A/\pi * R_{inner}^2$ preferably lies between ½ and 1/20, inclusive of the limits. This condition is met for example with a hemispherical inner shaped body having a radius $R_1 = 2$ mm and a semiconductor body whose square radiation-emitting front side has a side length $l = 1$ mm.

The inner shaped body 2 can be embodied for example as a potting resin. It can for example comprise a silicone and/or an epoxide or consist of one of these materials or a mixture of these materials.

The coupling-out lens 10 can for example likewise comprise epoxide or silicone or consist of one of these materials.

Furthermore, the coupling-out lens 10 can also comprise a glass or consist of a glass. A coupling-out lens 10 composed of glass can for example be produced separately and be applied to the component, while the coupling-out lens 10 composed of a potting resin material such as silicone or epoxide is generally produced on the component, for example by casting or by injection moulding.

The inner shaped body 2, the wavelength-converting layer 6 and the coupling-out lens 10 can be produced for example by a sequential injection-moulding method. In this case, the wavelength conversion substance 8 is generally introduced into a binder 9 and the coupling-out lens 10 comprises an injection-mouldable material, such as silicone for instance.

The semiconductor body 1 of the optoelectronic component in accordance with the exemplary embodiment in FIGS. 1A and 1B is applied to a carrier 14. The carrier 14 can be a printed circuit board, for example. The carrier 14 can also comprise one of the following materials or consist of one of these materials: aluminium oxide, aluminium nitride.

In the present case, a mirror 15 is arranged laterally with respect to the semiconductor body 1 on the carrier 14, said mirror also being formed between the semiconductor body 1 and the carrier 14. The mirror 15 preferably has a reflectance for radiation of the first and/or the second wavelength range of at least 0.9. Particularly preferably, the mirror 15 has a reflectance of at least 0.98 for radiation of the first and/or the second wavelength range.

The mirror 15 can be formed for example by a metallic layer 26. Furthermore, the mirror 15 can also comprise a metallic layer 26 and a Bragg mirror 27. In this case, the metallic layer 26 is preferably arranged between the carrier 14 and the Bragg mirror 27, while the Bragg mirror 27 forms the surface of the mirror 15. In general, the surface of the mirror 15 in this case has roughness peaks which are not formed higher than 40 nm. Such a mirror 15 is in particular generally embodied such that it is specularly reflective to visible radiation.

The metallic layer 26 can for example comprise aluminium or consist of aluminium.

The Bragg mirror 27 is for example constructed alternately from respectively two silicon oxide layers and two titanium oxide layers. That is to say that the Bragg mirror has two silicon oxide layers and two titanium oxide layers which are arranged alternately. The silicon oxide layers comprise silicon oxide or consist of silicon oxide. The titanium oxide layers comprise titanium oxide or consist of titanium oxide.

As shown in FIG. 1B, in the case of the component in accordance with the exemplary embodiment in FIGS. 1A and 1B, the mirror 15 is embodied in circular fashion with a radius $R_{mirror}$. The semiconductor body 1 is arranged in centred fashion on the circular mirror 15, that is to say that the center of area M of the radiation-emitting front side 3 of the semiconductor body 1 and the midpoint of the circular mirror 15 lie on the optical axis 4 of the optoelectronic component, said optical axis being perpendicular to the radiation-emitting front side 3 of the semiconductor body 1.

The coupling-out lens 10, the wavelength-converting layer 6 and the inner shaped body 2 are also applied in centred fashion above the semiconductor body 1, that is to say that the midpoint M' of the hemisphere and hemisphere shell respectively formed by the inner shaped body 2, the wavelength-converting layer 6 and also the coupling-out lens 10 and the center of area M of the radiation-emitting front side 3 of the semiconductor body lie on the optical axis 4 of the optoelectronic component. Furthermore, in the present case, the radius $R_3$ of the outer side 12 of the coupling-out lens 10 corresponds to the radius $R_{mirror}$ of the circle formed by the mirror 15. Consequently, the coupling-out lens 10 terminates laterally with the mirror 15.

Furthermore, the semiconductor body 1, the inner shaped body 2, the wavelength-converting layer 6 and the coupling-out lens 10 are arranged rotationally symmetrically with respect to the optical axis 4 of the optoelectronic component.

As shown in FIG. 1B, the optoelectronic component furthermore has two external electrical connection locations 16, which are provided for making electrical contact with the optoelectronic component.

Figure 2A:
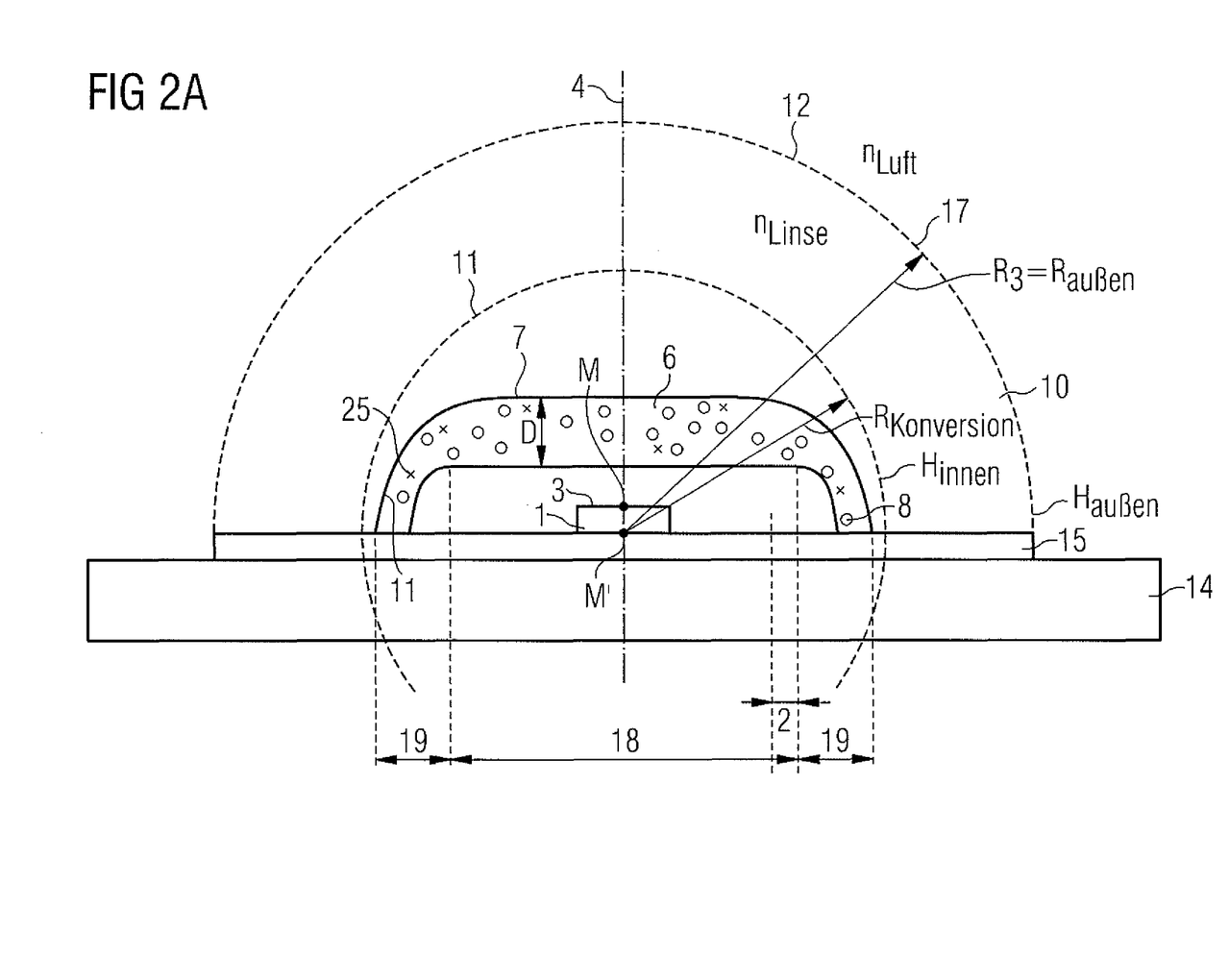
FIG. 2A shows a schematic sectional view of an optoelectronic component in accordance with a second exemplary embodiment.

In contrast to the optoelectronic component in accordance with the exemplary embodiment in FIGS. 1A and 1B the optoelectronic component in accordance with FIG. 2A has a wavelength-converting layer 6 whose thickness D varies. In order to avoid repetition, only the differences between the component in accordance with FIG. 2A and the component in accordance with FIGS. 1A and 1B are described below.

Elements and features not described in greater detail, such as, for instance the carrier 14 or the mirror 15, can be embodied for example as already described with reference to FIGS. 1A and 1B.

The optoelectronic component comprises a semiconductor body 1 suitable for emitting light of a first wavelength range, which comprises visible blue radiation.

The wavelength conversion substance 8 of the wavelength-converting layer 6 converts part of the blue radiation of the first wavelength range into radiation of a second wavelength range, which comprises visible yellow radiation. YAG:Ce, for example, is suitable as the wavelength conversion substance 8 for this purpose. A further part of the blue radiation emitted by the semiconductor body 1 passes through the wavelength-converting layer 6 without being converted. The optoelectronic component emits from its front side 17, which in the present case is formed by the outer side 12 of the coupling-out lens 10, mixed light comprising portions of blue radiation of the first wavelength range and also portions of yellow radiation of the second wavelength range. The said mixed light preferably has a chromaticity coordinate in the white region of the CIE standard chromaticity diagram.

In the present case, the wavelength-converting layer 6 is embodied in such a way that it is made thicker in an inner region 18 above the semiconductor body 1 than in an outer region 19 laterally with respect to the semiconductor body 1. The ratio between the thickness D of the wavelength-converting layer 6 in the inner region 18 and the thickness D of the wavelength-converting layer 6 in the outer region 19 is preferably approximately 5.5.

Owing to the variation in the thickness of the wavelength-converting layer 6, the wavelength conversion substance 8 converts into yellow radiation of the second wavelength range a larger part of the blue radiation of the first wavelength range that passes through the inner region 18 of the wavelength-converting layer 6 than of the blue radiation that passes through the wavelength-converting layer 6 in its outer region 19. However, since the semiconductor body 1 emits the blue radiation of the first wavelength range substantially from its front side 3, the proportion of blue radiation which is emitted in a direction of the inner region 18 is greater than the proportion of radiation which runs in a direction of the outer region 19. Owing to the variation of the thickness D of the wavelength-converting layer 6, therefore, the emission characteristic of the optoelectronic component is homogenized with regard to the chromaticity coordinate.

Furthermore, the wavelength-converting layer 6 can have scattering particles 25 provided for mixing unconverted radiation of the first wavelength range and converted radiation of the second wavelength range. As an alternative, or in addition, the inner shaped body 2 can also have scattering particles 25. The scattering particles 25 comprise for example aluminium oxide or titanium oxide or consist of one of these materials.

As in the exemplary embodiment in accordance with FIGS. 1A and 1B, the outer side 12 of the coupling-out lens 10 is embodied as a hemisphere area having a radius $R_3$. However, since the coupling-out area—in the same way as in the exemplary embodiment in accordance with FIGS. 1A and 1B is applied to the wavelength-converting layer 6 in direct contact, the inner side 11 of the coupling-out lens 10 is adapted to the outer side 7 of the wavelength-converting layer 6. The inner side 11 of the coupling-out lens 10 is therefore flattened in relation to a hemisphere area within an inner region corresponding to the inner region 19 of the wavelength-converting layer 6.

However, as in the coupling-out lens 10 in accordance with the exemplary embodiment in FIGS. 1A and 1B, the coupling-out lens 10 meets the Weierstrass condition as explained below. The outer hemisphere area $H_{outer}$ coincides with the outer side 12 of the coupling-out lens 10, and $R_3 = R_{outer}$ holds true. The inner side 11 of the coupling-out lens 10 is enclosed by an inner hemisphere area $H_{inner}$ having a radius $R_{conversion}$, and the following holds true: $R_{outer} \geq R_{conversion} * n_{lens}/n_{air}$. In particular, the Weierstrass hemisphere shell formed by the inner hemisphere area $H_{inner}$ and the outer hemisphere area $H_{outer}$ is free of the wavelength-converting layer 6.

Since the wavelength-converting layer 6 is applied to the inner shaped body 2 in direct contact, the shape of the inner shaped body 2 also deviates from the shape of the inner shaped body 2 as was described with reference to FIGS. 1A and 1B. The outer side 13 of the inner shaped body 2 is flattened in relation to a hemisphere area.

Furthermore the semiconductor body 1, the inner shaped body 2, the wavelength-converting layer 6 and the coupling-out lens 10 are arranged rotationally symmetrically with respect to the optical axis 4 of the optoelectronic component, said optical axis being perpendicular to the radiation-emitting front side 3 of the semiconductor body 1.

Figure 2B:
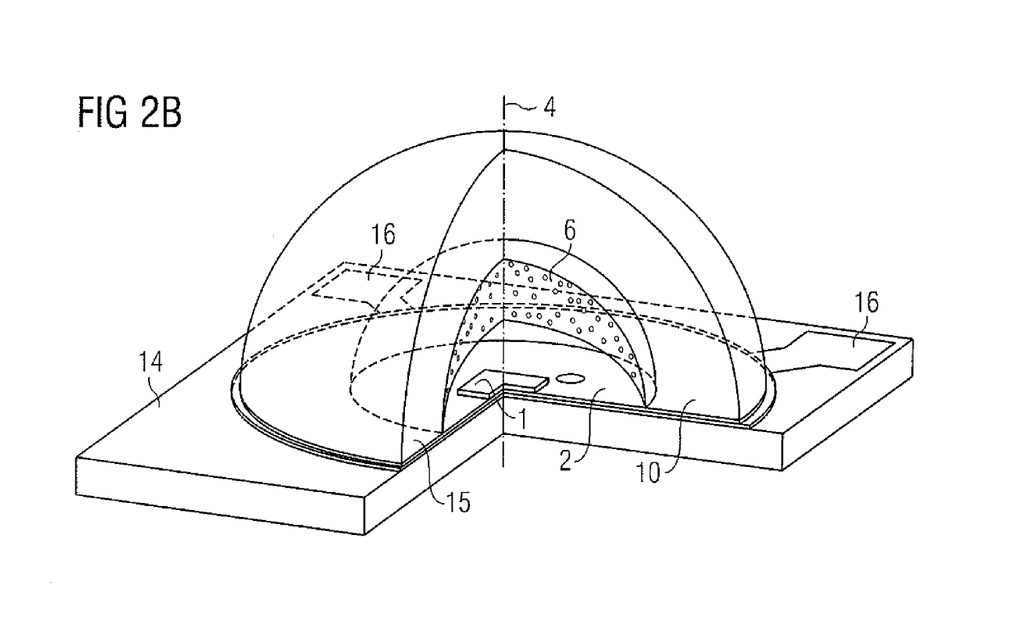
FIG. 2B shows a schematic perspective view of an optoelectronic component in accordance with a third exemplary embodiment.

Like the component in accordance with the exemplary embodiment in FIG. 2A, the component in accordance with the exemplary embodiment in FIG. 2B has a wavelength-converting layer 6 having a variable thickness D. Only the differences between the component in accordance with FIG. 2A and the component in accordance with FIG. 2B are described below, in order to avoid repetition. The remaining elements and features of the component in accordance with FIG. 2B can be embodied for example as already described with reference to FIG. 2A.

The wavelength-converting layer 6 of the component in accordance with FIG. 2A is made thicker in an inner region 18 above the semiconductor body 1 than in an outer region 19 laterally with respect to the semiconductor body 1. Therefore, the outer side 5 of the inner shaped body 2 deviates from a hemisphere shape. However, the outer side 7 of the wavelength-converting layer 6 is embodied in such a way that it forms a hemisphere area having a radius $R_2$. Therefore, the inner side 11 of the coupling-out lens 10, which is applied to the wavelength-converting layer 6 in direct contact, likewise forms a hemisphere area. The coupling-out lens 10 meets the Weierstrass condition: $R_{outer} \geq R_{conversion} * n_{lens}/n_{air}$, where the inner hemisphere area $H_{inner}$ having the radius $R_{conversion}$ coincides with the inner side 11 of the coupling-out lens 10, and $R_{conversion} = R_2$ holds true. The outer hemisphere area $H_{outer}$ coincides with the outer side 12 of the coupling-out lens 10, and $R_{outer} = R_3$ holds true.

In the inner region 18, the ratio between the thickness D of the wavelength-converting layer 6 and the radius $R_2$ is approximately 0.44, for example, while the ratio between the thickness D of the wavelength-converting layer 6 and the radius $R_2$ within the outer region 19 is for example a value of approximately 0.08. In this case, the transition between the inner region 18 and the outer region 19 in the thickness D of the wavelength-converting layer 6 generally proceeds continuously.

Figure 3:
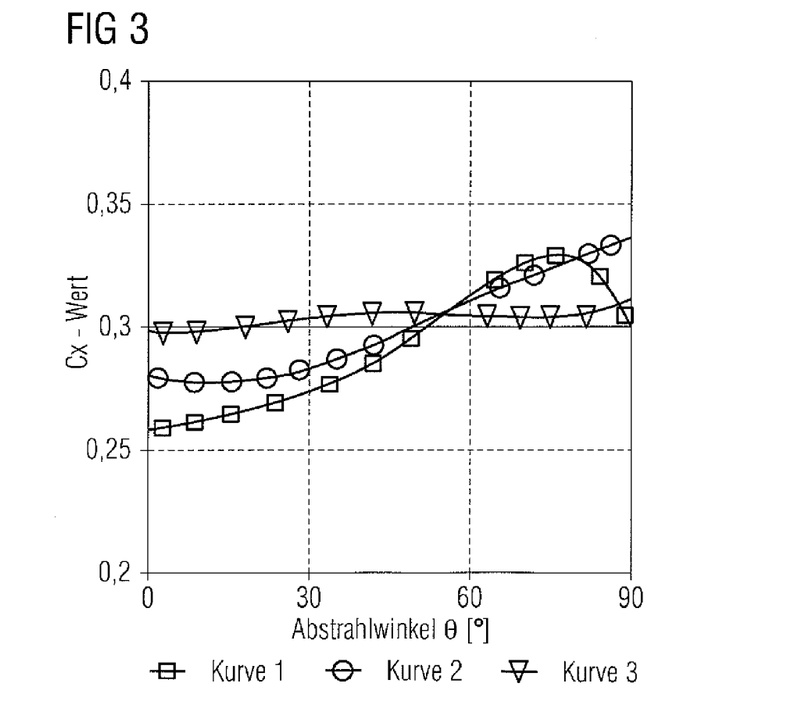
FIG. 3 shows the simulated characteristics of the Cx coordinate of the chromaticity coordinate as a function of the emission angle Θ of three different optoelectronic components.

FIG. 3 shows the simulated characteristics of the Cx coordinate of the chromaticity coordinate as a function of the emission angle of three different optoelectronic components. Firstly, the illustration shows the simulated Cx value of the chromaticity coordinate as a function of the emission angle Θ of a conventional component, in which the wavelength-converting layer 6 is applied directly to the radiation-emitting front side 3 of the semiconductor body 1 (curve 1). The chromaticity coordinate of the radiation emitted by such a component varies significantly with the emission angle Θ. In this case, the Cx value of the chromaticity coordinate is significantly smaller for small emission angles Θ than for large emission angles Θ. This means that an inner region of the radiation-emitting front side of the optoelectronic component has a bluish colour impression, while an outer region of the radiation-emitting front side of the optoelectronic component leaves the observer with a yellowish colour impression.

Furthermore, FIG. 3 shows the simulated characteristics of the Cx value of the chromaticity coordinate of an optoelectronic component comprising an inner shaped body 2, a wavelength-converting layer 6 having a constant thickness D on the inner shaped body and a coupling-out lens, such as has been described above with reference to FIGS. 1A and 1B (curve 2). Such an optoelectronic component also still has a slight fluctuation of the Cx value with the emission angle Θ. However, said fluctuation is significantly reduced by comparison with a conventional component.

The third curve (curve 3) in the graph in FIG. 3 shows the simulated characteristics of the Cx value with the emission angle Θ for a component whose wavelength-converting layer 6 is made thicker above the semiconductor body 1 than laterally, as was described with reference to FIGS. 2A and 2B. As can be gathered from FIG. 3, the emission characteristic of such a component is made virtually homogeneous with regard to the chromaticity coordinate.

Figure 4:
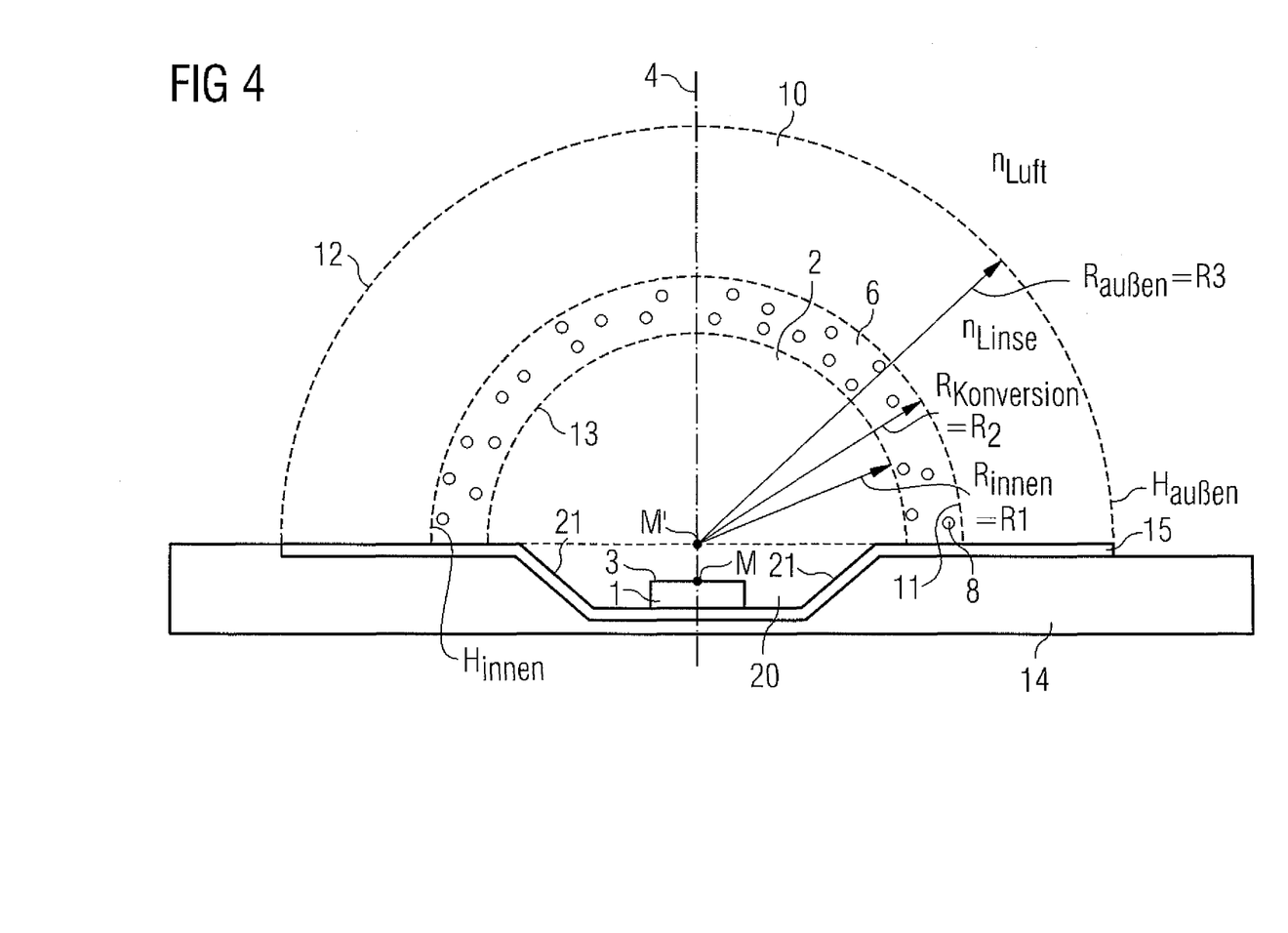
FIG. 4 shows a schematic sectional view of an optoelectronic component in accordance with a fourth exemplary embodiment.

The component in accordance with the exemplary embodiment in FIG. 4 has, in contrast to the exemplary embodiments described above, a carrier 14 with a reflector region 20, to which the semiconductor body 1 is applied.

The reflector region 20 is recessed relative to the rest of the surface of the carrier 14. In the present case, the reflector region 20 forms a cavity having oblique side walls 21. The reflector region is provided for directing radiation from the semiconductor body to the radiation-emitting front side of the optoelectronic component. Therefore, the mirror 15 is formed in particular on the reflector region 20 of the carrier 14. In the present case, the reflector region is embodied rotationally symmetrically with respect to the optical axis 4 of the component, said optical axis being perpendicular to the radiation-emitting front side 3 of the semiconductor body 1 and running through the center of area M of the radiation-emitting front side 3 of the semiconductor body 1.

In the present case, the semiconductor body 1 is embedded into a shaped body 2 in such a way that there is no air-filled space between the semiconductor body 1 and the inner shaped body 2. In the present case, this means that the cavity formed by the reflector region 20 in the carrier 14 is completely filled with the inner shaped body 2. Furthermore, the outer side 5 of the inner shaped body 2 is formed in accordance with a hemisphere area where $R_1 = R_{inner}$. As in the exemplary embodiment in accordance with FIGS. 1A and 1B, the wavelength-converting layer 6 and the coupling-out lens 10 are embodied as hemisphere shells which are in each case applied in direct contact with one another or with the inner shaped body. In contrast to the exemplary embodiment in FIGS. 1A and 1B, however, the midpoint M' of the hemisphere shells formed by the wavelength-converting layer 6 and the coupling-out lens 10 lies above the semiconductor body 1 in the emission direction of the semiconductor body 1 on account of the reflector region 20. However, the Weierstrass condition likewise holds true for the coupling-out lens 10. That is to say that the radius $R_{conversion}$ of the inner hemisphere area $H_{inner}$ and the radius of the outer hemisphere area $H_{outer}$ having the radius $R_{outer}$ meet the Weierstrass condition: $R_{outer} \geq R_{conversion} * n_{lens}/n_{air}$.

In the present case, the inner hemisphere area $H_{inner}$ coincides with the inner side 11 of the coupling-out lens 10, and $R_2 = R_{conversion}$ holds true. The outer hemisphere area $H_{outer}$ coincides with the outer side 12 of the coupling-out lens 10, and $R_3 = R_{outer}$ holds true.

The remaining elements and features of the component in accordance with FIG. 4 can be embodied for example as in the case of the optoelectronic component in accordance with the exemplary embodiment in FIGS. 1A and 1B. In order to avoid repetition, therefore, they are not described any further in the present case.

Figure 5:
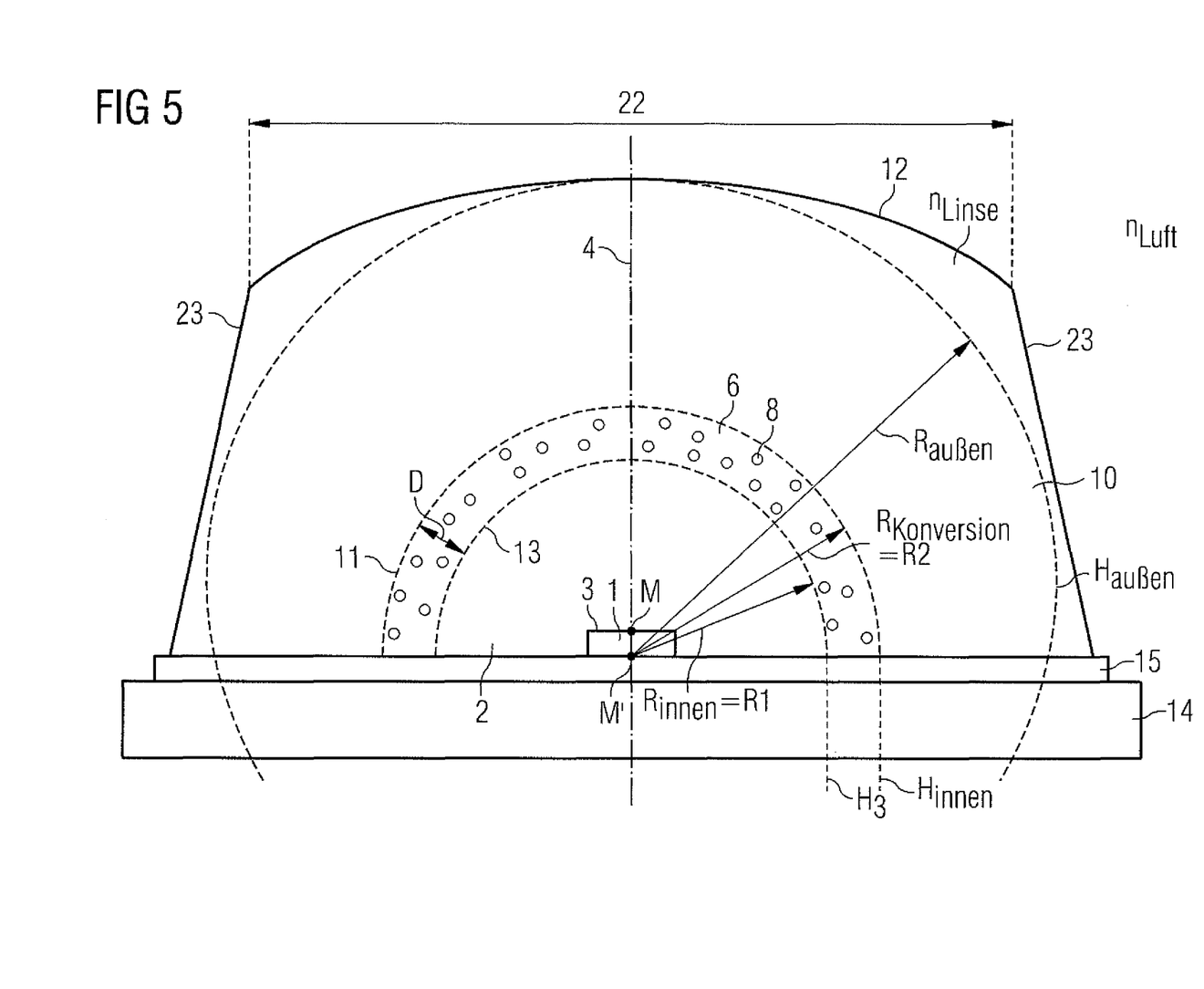
FIG. 5 shows a schematic sectional view of an optoelectronic component in accordance with a fifth exemplary embodiment.

In contrast to the optoelectronic component in accordance with the exemplary embodiment in FIGS. 1A and 1B, the optoelectronic component in accordance with the exemplary embodiment in FIG. 5 has a coupling-out lens 10 whose outer side 12 deviates from a hemisphere area. The outer side 12 of the coupling-out lens 10 is spherically curved with a radius of curvature $R_{curvature} > R_{outer}$ in an inner region 22, where $R_{outer}$ is the outer radius of the virtual Weierstrass hemisphere shell. Furthermore, the coupling-out lens 10 has oblique side areas 23 which laterally delimit the inner region of the coupling-out lens 10.

The coupling-out lens 10 having a refractive index $n_{lens}$ obeys the Weierstrass condition as explained below. The inner side 11 of the coupling-out lens 10 having the radius $R_2$ coincides with the hemisphere area $H_{inner}$ and $R_{conversion} = R_2$ holds true, while the outer side 12 of the coupling-out lens 10 encloses an outer hemisphere area $H_{outer}$ having a radius $R_{outer}$. The radii $R_{conversion}$ and $R_{outer}$ meet the Weierstrass condition: $R_{outer} \geq R_{conversion} * n_{lens}/n_{air}$, where $n_{air}$ is the refractive index of air.

The remaining elements and features of the component in accordance with FIG. 5 can be embodied for example as in the case of the optoelectronic component in accordance with the exemplary embodiment in FIGS. 1A and 1B. In order to avoid repetition, therefore, they are not described any further in the present case.

Figure 6A:
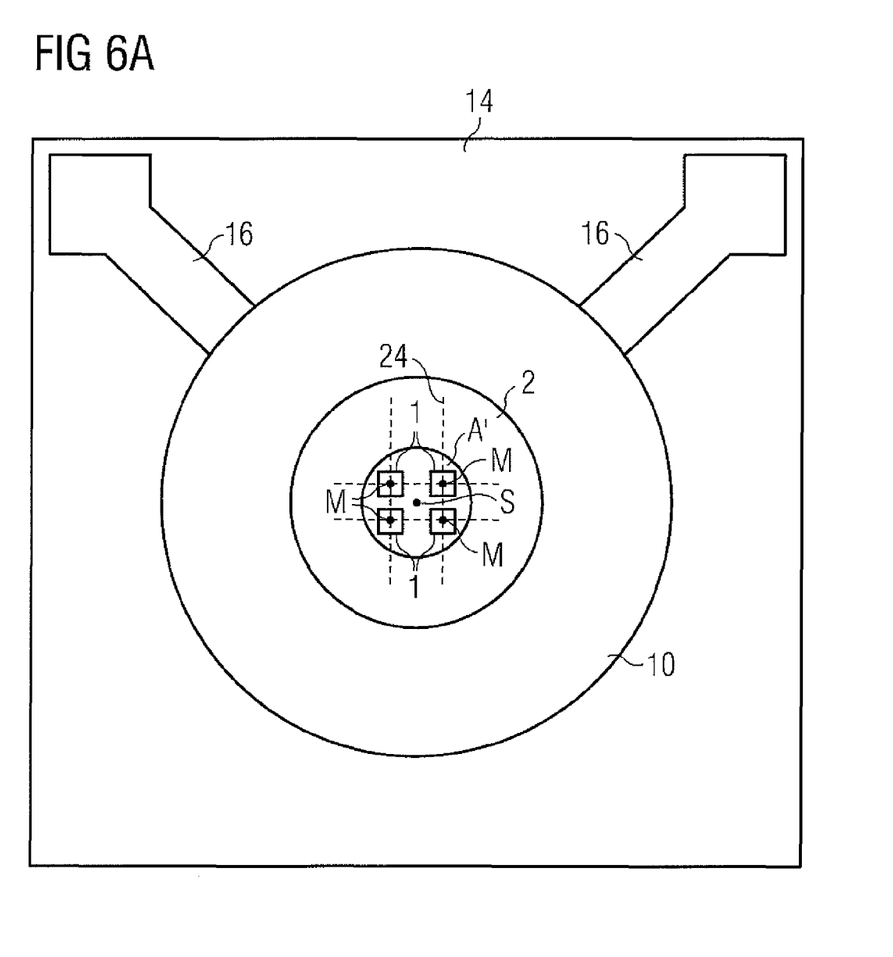
FIG. 6A shows a schematic plan view of an optoelectronic component in accordance with a sixth exemplary embodiment.
Figure 6B:
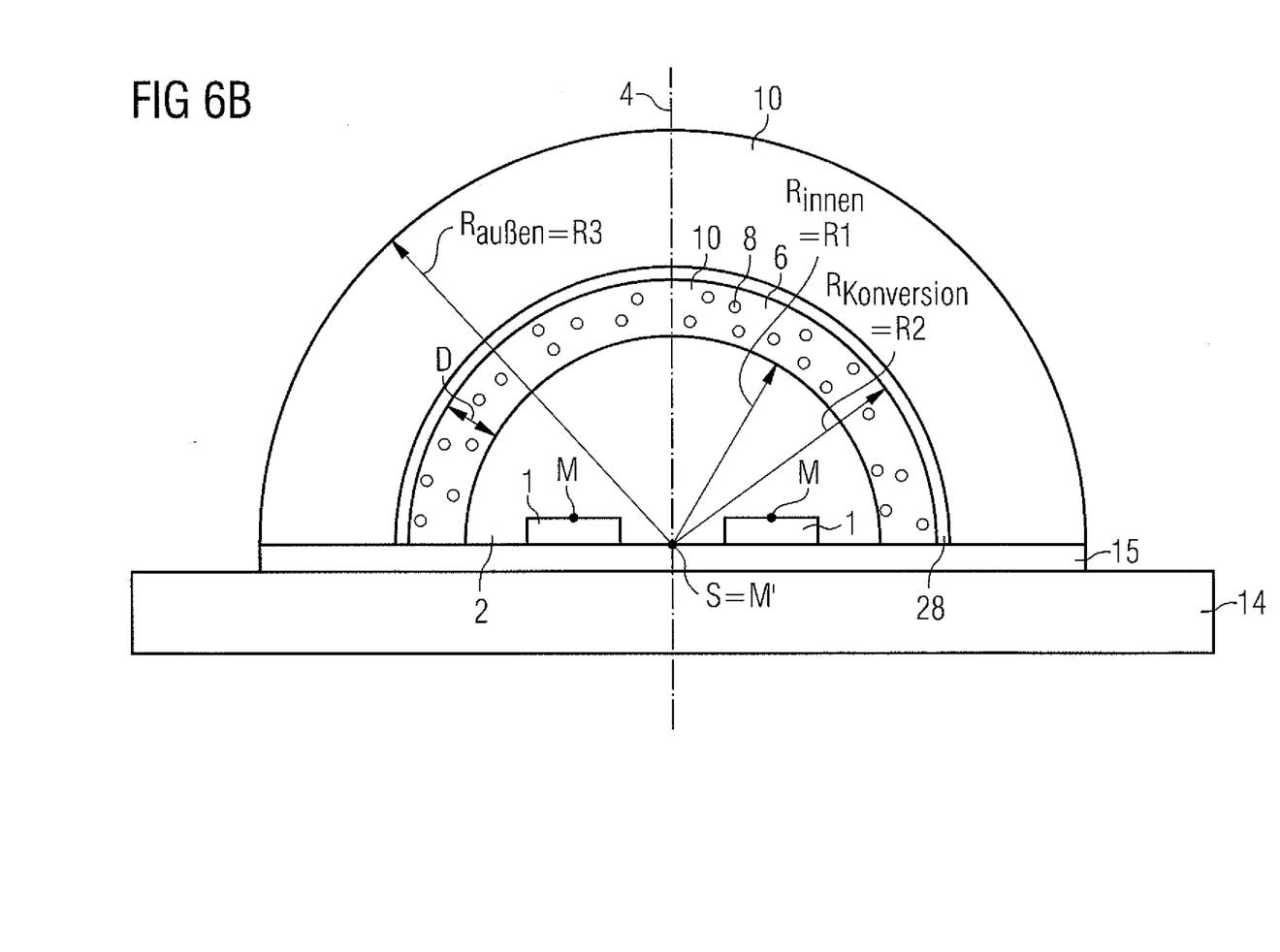
FIG. 6B shows a schematic sectional view of the optoelectronic component in accordance with FIG. 6A.

In contrast to the optoelectronic component in accordance with the exemplary embodiment in FIGS. 1A and 1B, the optoelectronic component in accordance with FIGS. 6A and 6B has a plurality of semiconductor bodies 1. In order to avoid repetition, only the differences between the component in accordance with FIGS. 6A and 6B and the component in accordance with FIGS. 1A and 1B are described below.

Elements and features which are not described can be embodied for example in accordance with the component of the exemplary embodiment in FIGS. 1A and 1B.

The semiconductor bodies 1 of the component in accordance with the exemplary embodiment in FIGS. 6A and 6B are arranged in a regular pattern, in the present case in accordance with a square grid 24. The semiconductor bodies 1 lie in each case with an center of area M of the radiation-emitting front side 3 on a grid point of the square grid 24. As an alternative, the semiconductor bodies 1 can for example also be arranged in accordance with a hexagonal grid. The semiconductor bodies 1 are arranged in centred fashion below the inner shaped body 2, that is to say that a centroid S of the square grid 24 and the midpoint M' of the hemisphere formed by the inner shaped body 2 lie on the optical axis 4 of the optoelectronic component, wherein the optical axis is perpendicular to the mirror 15. The coupling-out lens 10 is also arranged in centred fashion above the semiconductor bodies 1, that is to say that the centroid S of the square grid 24 and the midpoint M' of the hemisphere shell formed by the coupling-out lens 10 lie on the optical axis 4 of the optoelectronic component. In the present case, the centroid S of the square grid 24 is likewise a point of symmetry of the grid 24.

The four semiconductor bodies 1 of the optoelectronic component of the exemplary embodiment in FIGS. 6A and 6B are inscribed by a circle having an area A' wherein a respective outer corner of a semiconductor body 1 lies on the inscribing circle. The inner shaped body 2 is enclosed by a further, likewise virtual, hemisphere area $H_3$ having a radius $R_{inner}$. In the present case, an outer side 13 of the inner shaped body 2 coincides with the further hemisphere area $H_3$ and $R_{inner} = R_1$ holds true. In this case, the ratio $A'/\pi * R_{inner}^2$ preferably lies between ½ and 1/20, inclusive of the limits.

The semiconductor bodies 1 emit ultraviolet radiation, for example, that is to say that the first wavelength range comprises ultraviolet radiation. In this case, it is generally endeavoured to completely convert the ultraviolet radiation of the first wavelength range into visible radiation by means of the wavelength conversion substance 8. Furthermore, the coupling-out lens 10 is in this case embodied such that it is absorbent for ultraviolet radiation, for example by virtue of said lens comprising a glass. Furthermore, as shown in FIG. 6B, in this case preferably a reflective layer 28 is arranged on the inner side 11 of the coupling-out lens 10, which is embodied such that it is reflective to ultraviolet radiation and permeable to visible radiation. The reflective layer 18 can be a dielectric mirror, for example.

The invention is not restricted by the description on the basis of the exemplary embodiments. Rather, the invention encompasses any new feature and also any combination of features, which in particular comprises any combination of features in the patent claims, even if this feature or this combination of features itself is not explicitly specified in the patent claims or exemplary embodiments.

The invention claimed is:

1. An optoelectronic component comprising:
    at least one semiconductor body provided for emitting electromagnetic radiation of a first wavelength range;
    an inner radiation-permeable shaped body, into which the semiconductor body is embedded;
    a wavelength-converting layer on an outer side of the inner shaped body, said layer comprising a wavelength conversion substance suitable for converting radiation of the first wavelength range into radiation of a second wavelength range, which is different from the first wavelength range; and
    a coupling-out lens, into which the inner shaped body and the wavelength-converting layer are embedded, wherein the coupling-out lens has an inner side enclosed by an inner hemisphere area having a radius $R_{conversion}$, and an outer side enclosing an outer hemisphere area having a radius $R_{outer}$, and the radii $R_{converstion}$ and $R_{outer}$ meet the Weierstrass condition:

$$R_{outer} \geq R_{conversion} * n_{lens}/n_{air},$$

where $n_{lens}$ is the refractive index of the coupling-out lens and $n_{air}$ is the refractive index of the surroundings of the coupling-out lens, and the inner shaped body is enclosed by a further hemisphere area having a radius $R_{inner}$, the semiconductor body has a radiation-emitting front side having an area A, and the ratio $A/\pi * R_{inner}^2$ lies between ½ and 1/20 inclusive of the limits.

2. The optoelectronic component according to claim 1, which comprises a plurality of semiconductor bodies provided for emitting electromagnetic radiation.

3. The optoelectronic component according to claim 1, wherein the inner shaped body is shaped in the manner of a hemisphere and is arranged in centred fashion above the semiconductor body.

4. The optoelectronic component according to claim 1, wherein the wavelength-converting layer is embodied as a hemisphere shell applied to the inner shaped body in direct contact.

5. The optoelectronic component according to claim 1, wherein the coupling-out lens is shaped in the manner of a hemisphere shell and is arranged in centred fashion above the semiconductor body and is applied to the wavelength-converting layer in direct contact.

6. The optoelectronic component according to claim 1, wherein the semiconductor body is applied to a carrier and the carrier has a mirror at least laterally with respect to the semiconductor body.

7. The optoelectronic component according to claim 6, wherein the mirror has a reflectance of 0.98 for radiation of the first and/or the second wavelength range.

8. The optoelectronic component according to claim 6, wherein the mirror, at least laterally with respect to the semiconductor body, is embodied such that it is specularly reflective to radiation of the first and/or the second wavelength range.

9. The optoelectronic component according to claim 6, wherein the semiconductor body is arranged in a reflector region of the carrier.

10. The optoelectronic component according to claim 1, wherein the inner shaped body and/or the wavelength-converting layer have scattering particles.

11. The optoelectronic component according to claim 1, wherein the wavelength-converting layer is made thicker within an inner region above the semiconductor body than within an outer region laterally with respect to the semiconductor body.

12. The optoelectronic component according to claim 11, wherein the first wavelength range comprises blue radiation of the visible spectral range and the second wavelength range comprises yellow radiation of the visible spectral range.

13. The optoelectronic component according to claim 1, wherein the first wavelength range comprises radiation from the ultraviolet spectral range.

14. The optoelectronic component according to claim 1, wherein a reflective layer embodied such that it is reflective to radiation of the first wavelength range and permeable to radiation of the second wavelength range is arranged on the inner side of the coupling-out lens.

15. An optoelectronic component comprising:
at least one semiconductor body provided for emitting electromagnetic radiation of a first wavelength range;
an inner radiation-permeable shaped body, into which the semiconductor body is embedded;
a wavelength-converting layer on an outer side of the inner shaped body, said layer comprising a wavelength conversion substance suitable for converting radiation of the first wavelength range into radiation of a second wavelength range, which is different from the first wavelength range; and
a coupling-out lens, into which the inner shaped body and the wavelength-converting layer are embedded, wherein the coupling-out lens has an inner side enclosed by an inner hemisphere area having a radius $R_{conversion}$, and an outer side enclosing an outer hemisphere area having a radius $R_{outer}$, and the radii $R_{converstion}$ and $R_{outer}$ meet the Weierstrass condition:

$$R_{outer} \geq R_{conversion} * n_{lens}/n_{air},$$

where $n_{lens}$ is the refractive index of the coupling-out lens and $n_{air}$ is the refractive index of the surroundings of the coupling-out lens, and the wavelength-converting layer is made thicker within an inner region above the semiconductor body than within an outer region laterally with respect to the semiconductor body.

* * * * *